United States Patent [19]
Schmidt et al.

[11] Patent Number: 5,710,561
[45] Date of Patent: Jan. 20, 1998

[54] METHOD AND APPARATUS FOR DOUBLE RUN-LENGTH ENCODING OF BINARY DATA

[75] Inventors: Ken Schmidt, Torrance; Jeff Horowitz, Sherman Oaks, both of Calif.

[73] Assignee: Peerless Systems Corporation, El Segundo, Calif.

[21] Appl. No.: 582,150

[22] Filed: Jan. 2, 1996

[51] Int. Cl.$^6$ .................................................. H03M 7/50
[52] U.S. Cl. ........................... 341/63; 341/59; 341/24; 341/87
[58] Field of Search ............................. 341/59, 63, 74, 341/87

[56] References Cited

U.S. PATENT DOCUMENTS

| | | | |
|---|---|---|---|
| 4,679,094 | 7/1987 | Rutherford et al. | 358/261 |
| 4,971,407 | 11/1990 | Hoffman | 341/87 |

FOREIGN PATENT DOCUMENTS 5639266  8/1996  Japan.

*Primary Examiner*—Jeffrey A. Gaffin
*Assistant Examiner*—Jason A. Vick
*Attorney, Agent, or Firm*—Blakely Sokoloff Taylor & Zafman

[57] ABSTRACT

A method and apparatus for losslessly compressing binary data using a technique referred to as Double Run-Length Encoding (DRLE). DRLE has particular application to the compression of gray-scale data as it is being processed for printing by a laser printer or other continuous raster scan device. DRLE records repeating patterns of ones and zeros with little computational complexity. Compression ratios that may be an order of magnitude or more are obtained frequently on data that may not compress well using traditional Run-Length Encoding (RLE). DRLE uses a sequential history of order-pairs that denote variable-length patterns of zeros and ones, and then encodes these patterns as they repeat themselves.

12 Claims, 7 Drawing Sheets

METHOD AND APPARATUS FOR DOUBLE RUN-LENGTH ENCODING OF BINARY DATA

SUMMARY OF THE INVENTION

A method is disclosed for losslessly compressing binary data referred to herein as Double Run-Length Encoding (DRLE), having particular application to the compression of gray-scale data as it is being processed for printing by a laser printer or other continuous raster scan device. The DRLE method efficiently records repeating patterns of ones and zeros with little computational complexity. Compression ratios that may be an order of magnitude or more are obtained frequently on data that may not compress well using traditional Run-Length Encoding (RLE). DRLE uses a sequential history of order-pairs that denote variable-length patterns of zeros and ones, and then efficiently and adaptively encodes these patterns as they repeat themselves.

DRLE provides high compression ratios for gray-scale data which is typical of binary images of pages to be printed on a digital printer. DRLE allows many pages which do not normally compress well using traditional Run-Length Encoding (RLE) to be represented in a computationally efficient way while significantly reducing the amount of memory needed to hold these pages. The computational efficiency lends itself well to both software and hardware implementations with real-time constraints, while the typically high compression ratio is ideal for today's low-cost high-resolution monochrome and color ink jet and laser printers.

A theoretical basis for DRLE and a discussion of its application toward gray-scale imaging is also provided. Gray-scale imaging typically applies to digital monochrome printers or planar color printers with one bit per pixel per color plane.

BRIEF DESCRIPTION OF THE DRAWINGS

FIGS. 5a and 5b show double run-length encoding of gray-scale data.

DETAILED DESCRIPTION OF THE INVENTION

Double Run-Length Encoding (DRLE) according to the present invention has three fundamental elements:

1. Double runs.

An ordered pair whose elements represent a concatenation of a run of zeros and a run of ones within the data to be compressed.

2. Encoding of literals and repeaters.

The format of the output of DRLE contains literals denoting double runs and repeaters for recurring instances of double runs.

3. Pattern Matching.

An adaptive method of detecting recurring and variable length patterns of double runs.

Each of these elements are discussed in detail below. The first two are the data structures used to represent compressed data and are the principal components of DRLE. Different pattern matching algorithms give varying degrees of compression. For gray-scale data, DRLE employs the Most Recent (MR) double run scheme. Other schemes include Most Recent Pattern Change (MRPC) and Predefined Fixed Pattern (PFP) which are applicable to data containing patterns embedded in patterns, or data for which specific patterns are known to exist prior to applying DRLE, respectively. Each of these pattern matching schemes are described below.

The following is a discussion directed to a formal model of lossless compression and DRLE. Examples of DRLE are then shown. These illustrate how DRLE works algorithmically and how the compression ratio may vary mathematically under certain conditions. DRLE's application to gray-scale data is then described.

Theoretical Model

Figure 1:
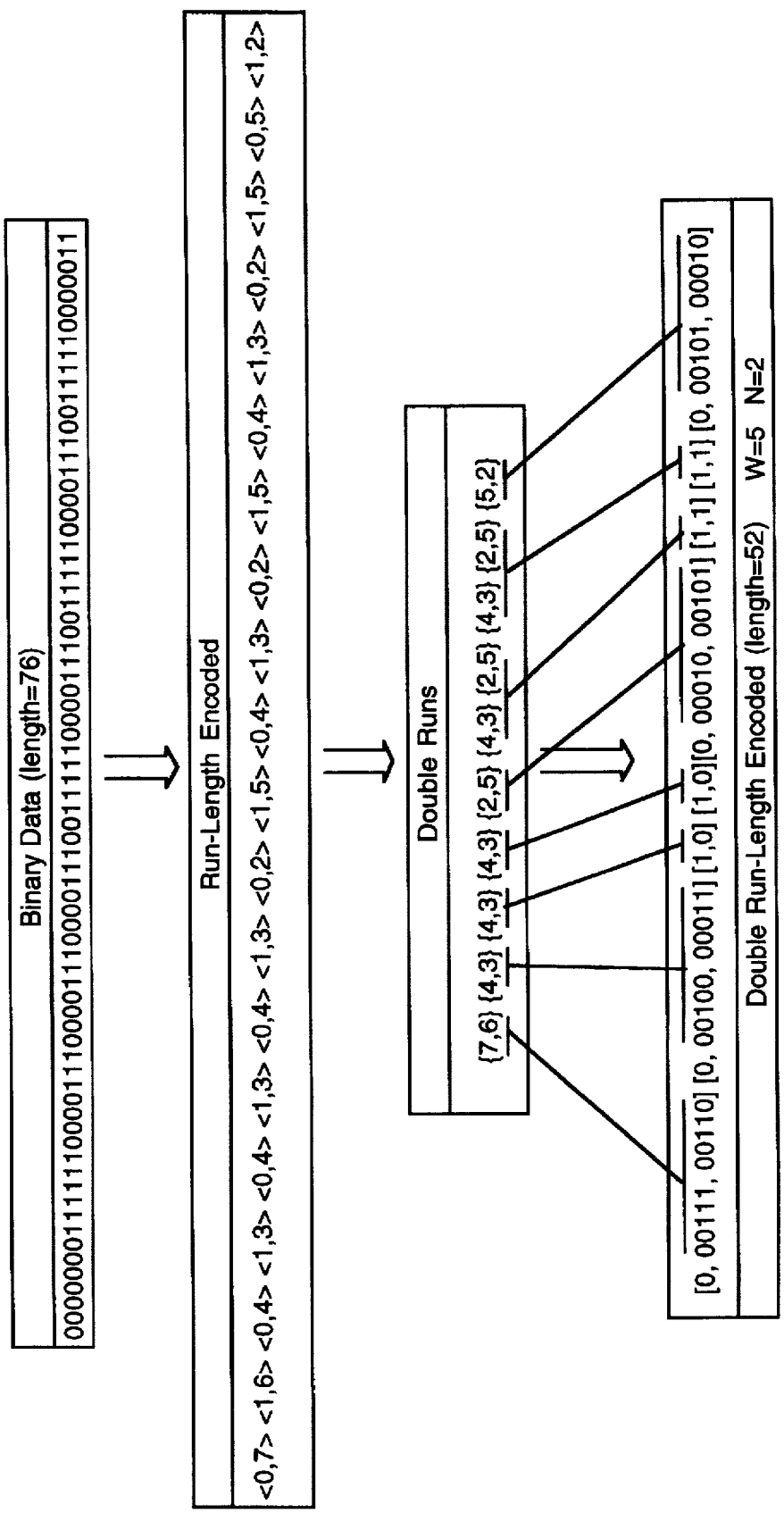
FIG. 1 shows different representations of binary data.

Arbitrary binary data can be thought of as a random sequence of zeros and ones (see the top of FIG. 1). In this discussion, notation and terminology are introduced that allow a formal description of lossless compression using RLE and DRLE.

The smallest element of binary data is a bit (i.e., a zero or a one). The total number of bits is called the length of the data. Lossless compression of binary data is a transformation applied to that data such that the transformation is invertible (i.e., lossless), and produces binary data having a smaller length (i.e., compresses).

Lossless Compression

Let $$T(x)=y$$

denote an arbitrary transformation T of binary data x producing binary data y.

The transformation T(x) is lossless if and only if there exists transformation $T^{-1}(y)$ such that:

$$T^{-1}(T(x))=x \text{ for all } x.$$

$T^{-1}(y)$ is called the inverse transformation of T (x). In terms of lossless compression, $T^{-1}(y)$ is called the decompression or expansion transformation.

The length of binary data x is the number (or count) of bits that compose x.

Let $$L(x)$$

denote the length of x.

A lossless transformation T(x) of x is compressed if $$L(T(x))<L(x).$$

The compression ratio R(T(x)) of T(x) is defined as $$R(T(x))=L(x)/L(T(x)).$$

The fundamental goal of T(x) is for $$R(T(x))\gg 1.$$

Run-Length Encoding

A run is a pattern that repeats itself without any intervening data. For example, a "run of five zeros" is to say five consecutive zeros.

Run-Length Encoding (RLE) is a well-known lossless compression method which represents runs as an ordered-pair of the form <pattern, repetitions>, where repetitions determines the number of consecutive occurrances of pattern. Since expanding a run into its pattern repeated the appropriate number of times reproduces the original binary form, it is easy to determine that RLE is indeed a lossless transformation, and is one which compresses repeating patterns of suitable size quite well.

The value of repetitions is limited by the number of bits used to represent it. If W bits are used to represent repetitions, then the length of one RLE ordered pair is $$L(\text{<pattern, repetitions>})=(L(\text{pattern})+W).$$

Clearly, RLE is an effective lossless compression method when $$(\text{repetitions}*L(\text{pattern}))\gg(L(\text{pattern})+W),$$

or $$1\gg((1/\text{repetitions})+(W/(\text{repetitions}*L(\text{pattern})))).$$

Consequently, RLE is most suitable for data with patterns that repeat many times.

The middle of FIG. 1 shows an example of RLE for the binary data at the top of FIG. 1. In this example, the length of a pattern is one bit giving two possible patterns: zero or one. Each ordered pair in the run-length encoding example of FIG. 1 indicates the pattern followed by the number of consecutive instances of the pattern. For the particular bit pattern of binary data of 76 bits shown in FIG. 1, RLE compression does not provide an advantage since each ordered pair requires 4 bits (1 bit for the pattern, 0 or 1, and 3 bits for the number of consecutive instances from 0–7) and 20 ordered pairs are required for a total of 80 bits. In this connection, it should be noted that since a pattern occurs at least once when it appears in encoded form, a software or hardware implementation of RLE might record the number adjacent repetitions rather than the number of occurrences so that one more repetition can be accounted for in the number of bits used for the repetition count. Although in this example only 1-bit-wide patterns are encoded, an application of RLE typically allows larger patterns such as bytes or sequences of bytes, and may even allow for variable-length patterns, although this is significantly more difficult and expensive computationally. It should be noted that DRLE deals fundamentally with variable length patterns, and does so in a computationally efficient way.

Double Run-Length Encoding

Double Run-Length Encoding (DRLE) is a lossless compression transformation that gives high compression ratios for gray-scale data. Gray-scale data is binary data for which the repeating patterns of ones and zeros represent different shades of gray. A pattern with a lot of ones and not too many zeros typically represents a dark gray, while a pattern with few ones and lots of zeros will typically represent light gray.

A hardware or software implementation of DRLE detects gray-scale patterns and uniquely and efficiently encodes these patterns in a compressed form. This is done by recording a temporal history of ordered pairs denoting adjacent runs of zeros and ones (white and black pixels, respectively, in terms of gray-scale), called double runs, encoding these double runs as literals, and then encoding adjacent occurrences of these double runs as repeaters. Repeaters use a minimum number of bits so as to give the most compact encoding. It is often the case that the length of the compressed form is significantly less than the original binary data.

In addition to the notions of double run, literal, and repeater, DRLE uniquely extends RLE by allowing small runs to be encoded efficiently and by allowing several patterns to be encoded simultaneously. Each double run represents a run of zeros followed by a run of ones, and the history represents the temporal sequence of double runs. Repeaters allow a most recent sub-sequence of the history to be efficiently encoded using as few as two bits.

The examples in FIGS. 1–5 show double runs using the following notation for DRLE:

$$\{L_0, L_1\}$$

where $L_0$ is the number of zeros and $L_1$ is the number of ones, respectively, in the double run,

Encoding Formats

Binary data produced using DRLE uses two basic data items: literals and repeaters. The following is a description of a physical format of these data items.

The first bit of a literal or a repeater is a tag that determines the type of the data item: zero for literal, and one for repeater. The remainder of a format depends upon whether an element is a literal or a repeater.

The format of a literal is a triple of the form $$\{0, L_0, L_1\}.$$

The first element is a tag bit that, when 0, indicates that the data item is a literal. The second element, $L_0$, is the number of consecutive zeros in the pattern. The third element is the number of consecutive ones immediately following the zeros. For example, the literal "$\{0, 4, 3\}$" represents the pattern "0000111".

The format of a repeater is:

$$\{1, n\}.$$

The first element is a tag-bit that, when 1, indicates that the data item is a repeater. The second element, n, identifies the number of double runs in the pattern.

The second element of a repeater relates to the temporal history of double runs. An implementation of DRLE maintains a sequence of double runs in the form of an ordered first-in-first-out list to use for pattern matching. The method for maintaining this sequence may vary, and three such methods are described below. The actual number of double runs in this list is a sizing parameter of DRLE as discussed below and may affect the compression ratio. The value of n for a repeater is a relative offset into this list. The pattern is the most recent sub-sequence of double runs in the current list beginning at that relative offset. For example, a repeater for the most recent double run is "{1, 0}" whereas a repeater for the two most recent double runs is "{1, 1}". In general, the repeater for the n most recent double runs is "{1, n−1}".

Sizing Parameters

There are two parameters which control the sizing of literals and repeaters (i.e., the number of bits each of these requires):

W: the number of bits used to represent the length of a run of zeros or a run of ones, and N: the maximum number of double runs in the history.

The value of W implies that a run of zeros and a run of ones in a literal may each range in length from zero to $2^W-1$. Since W determines the size of a run, it also controls the size of a literal.

The value of N determines the number of bits needed for the second element (literal offset) of a repeater. This, in other words, determines the number of double runs kept in the history. Using these parameters, the fixed-lengths of literals and repeaters are:

$$L(literal)=1+(2*W),$$

and $$L(repeater)=1+ceiling(log_2(N)),$$

respectively, where the function ceiling (r) produces the smallest integer greater than or equal to the real number r.

Figure 2:
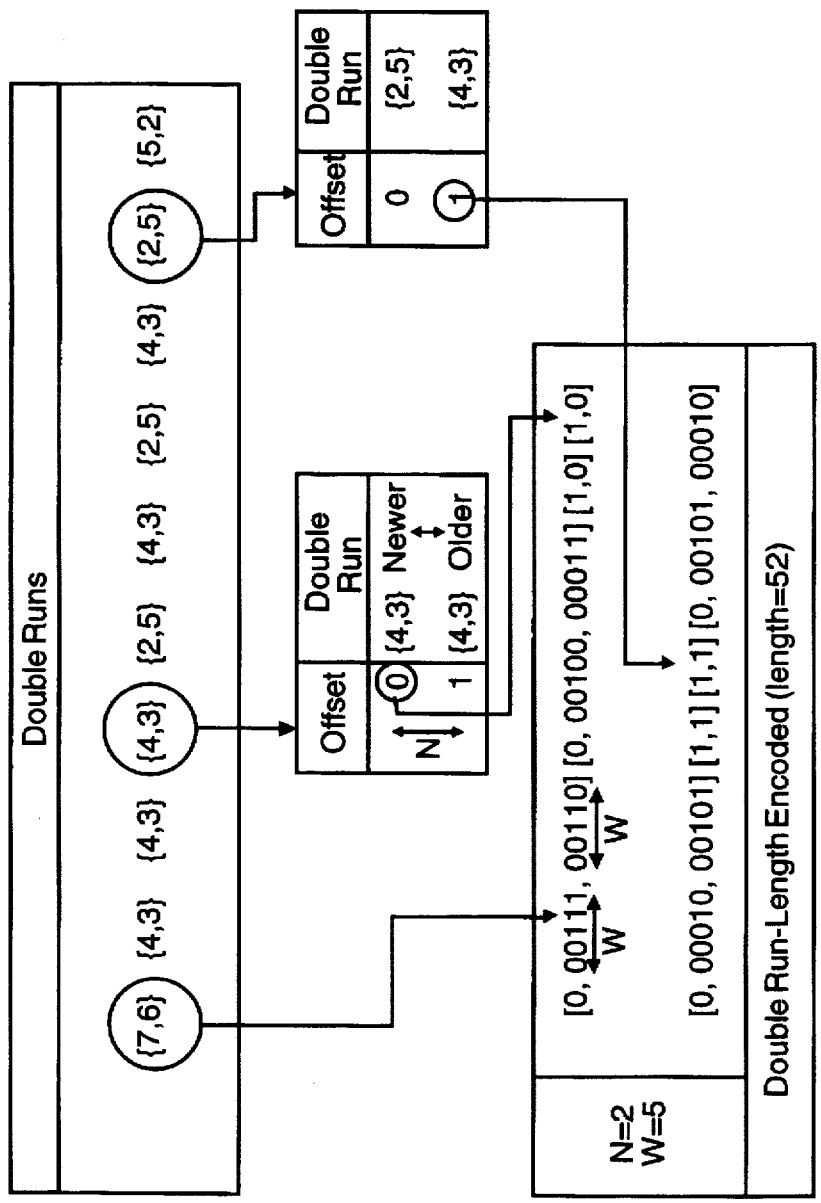
FIG. 2 shows an example of double run-length encoding using the most recent (MR) history.

The effects of these parameters is shown in FIG. 2. This figure highlights some of the elements of the example in FIG. 1 and is discussed in detail as Example 1 below.

DRLE Compression Method

Conceptually, an implementation of DRLE typically scans binary data left-to-right pulling off one double run at a time. It maintains a history of the double runs using a recording mechanism. The number of elements in this history is at most N.

The mechanism for keeping a history of double runs may vary. By way of example, three methods which may be utilized are:

1. most recent (MR),
2. most recent pattern change (MRPC), and
3. predefined fixed pattern (PFP).

The MR mechanism keeps a running list of size N of double runs as they are encountered in the binary data. When a new double run is obtained, it is added to the front or head of the list. This is the approach shown in FIG. 2 and is the approach most appropriate for gray-scale data.

Figure 3:
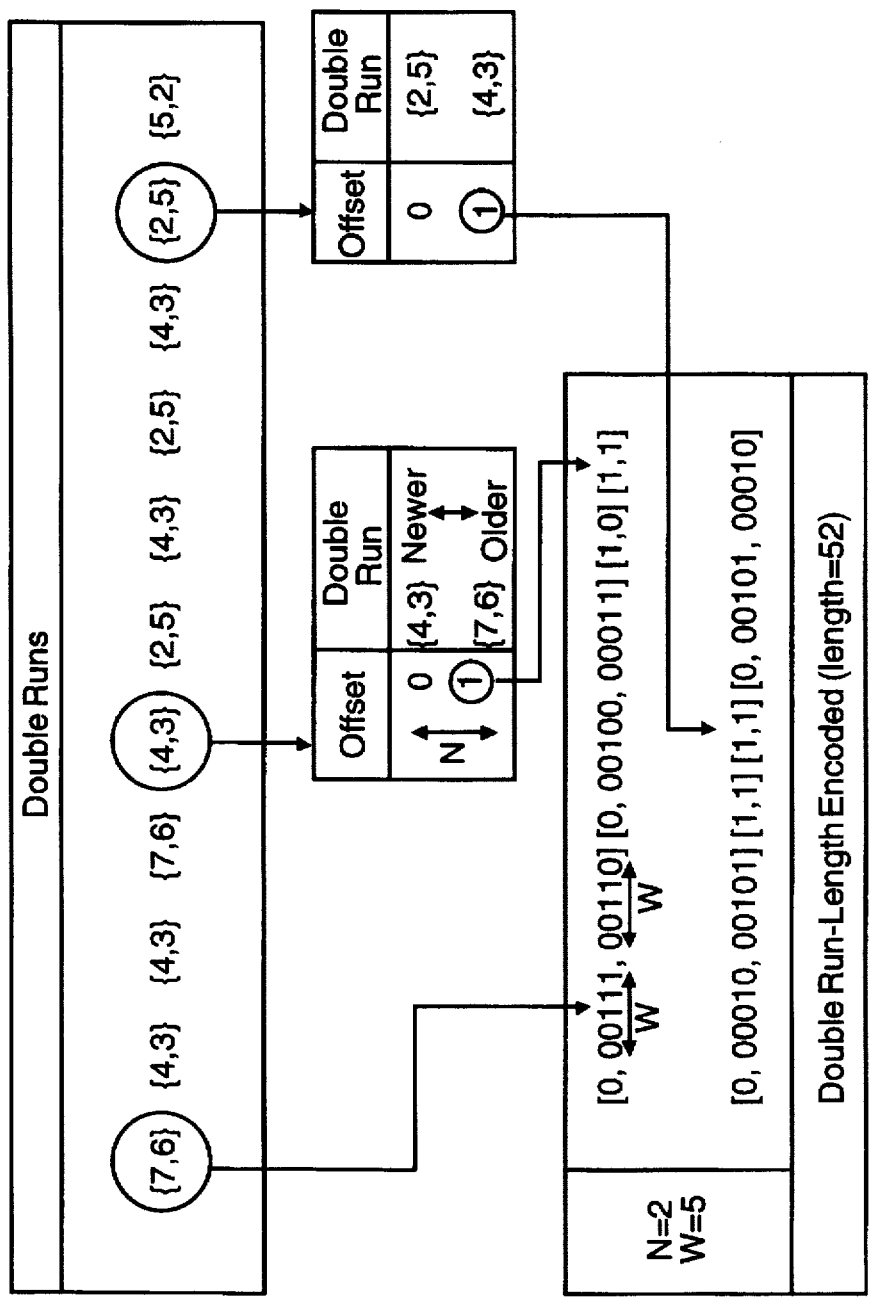
FIG. 3 shows an example of double run-length encoding using the most recent pattern change (MRPC).

The MRPC mechanism is an alteration of the MR mechanism which only changes the history when a pattern mismatch occurs. FIG. 3 shows this approach for the case N=2. This approach is appropriate for data in which patterns are embedded within larger patterns.

Figure 4:
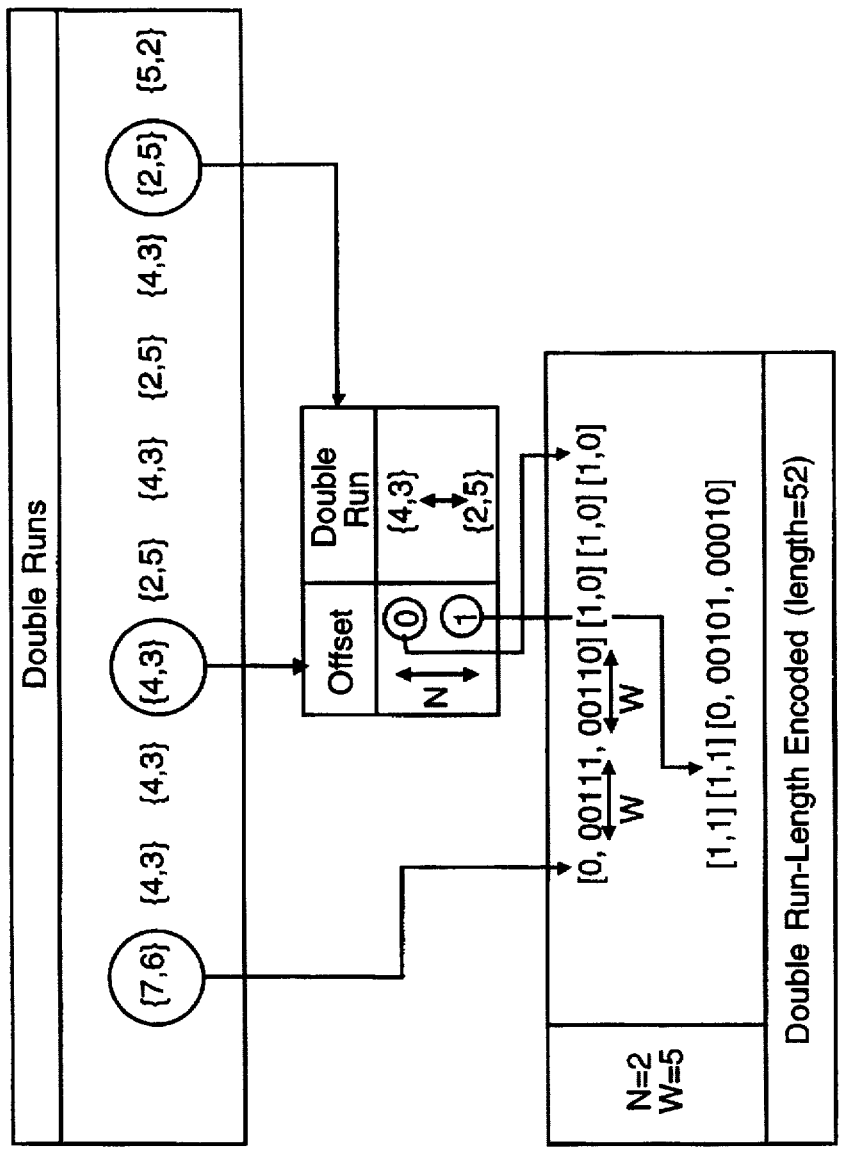
FIG. 4 shows an example of DRLE using predefined fixed pattern (PFP).

The PFP mechanism uses a predefined double-run pattern of size N and only looks for instances of this pattern or its sub-patterns. The history does not change. An example of this is shown in FIG. 4. This scheme is appropriate if one has prior knowledge about the data. Typically PFP is appropriate for data in which a finite sequence, for which N and W are sufficiently large to achieve good compression, is known to occur frequently in full or partial form.

Since the result of DRLE may vary according to the mechanism employed for keeping a history of double runs, this method must also be an input into the decompression method. Consequently, although theoretically the transformations DRLE(x) and $DRLE^{-1}(y)$ are present, algorithmically, each of these has an additional parameter.

Pattern Matching

In addition to the history, DRLE implementations also maintain a look-ahead buffer of the most-recent double runs for which neither the literals nor a repeater has been emitted. If a full match of a sub-sequence of the most-recent history is encountered, then a repeater is emitted. Otherwise the literals for the double runs in the look-ahead buffer up to the first mismatch are emitted. In either case, the affected double runs are then discarded from the look-ahead buffer.

Initial State

An appropriate choice for the initial state of the double run history can improve the compression ratio. Certainly for PFP the initial state is the predefined fixed pattern. For gray-scale data, an initial state of "all white, no black" for each literal in the history is recommended since pages to print usually begin with and consist mostly of white space. More formally, for gray-scale data, the initial value of each double run in the history should be $$\{2^W-1, 0\}.$$

EXAMPLES

The first example describes FIG. 2. Examples 2 and 3 show some boundary conditions for DRLE, namely binary data of nothing but zeros (a blank page) and binary data consisting of one repeating pattern.

Example 1

FIG. 2 exemplifies DRLE for the case where W=5 and N=2 using MR. In this case the length of a literal is 11 bits, and the length of a repeater is 2. The example results in four literals and four repeaters for a total length of 52 bits and a compression ratio of 76/52.

To show the effect of W, the value of the length elements in literals is shown in binary form. For example, the first double run {7,6} results in literal [0,00111,00110] since "00111" and "00110" are the 5-bit binary equivalents of 7 and 6 respectively.

Proceeding left-to-right, the first instance of {4,3} results in a literal. However, the second instance of {4,3} matches the head of the two-element history thus resulting in a repeater with value [1,0].

Continuing, the third instance of {4,3} results in a repeater and the first instance of {2,5} results in a literal.

At this point, the next two double runs, {4,3} and {2,5}, match the first two (and only two) elements in the temporal history. Therefore, a repeater of value [1,1] results. This same pattern repeats itself once more so a repeater of value [1,1] results again.

Last, a literal for double run {5,2} results.

Example 2

Consider binary data S of length L(S) consisting entirely of zeros with an initial state of the history being filled with "all white, no black" double runs (e.g., {$2^W-1\ 0$}) This form of S is analogous to a fully-rendered blank page.

In this case, each N occurrences of consecutive "all white, no black" double runs is replaced by a repeater of the form [1, N-1].

Let M be the number of "all white, no black" double runs in S. It may be that M is not evenly divisible by N. In other words, it may be that $$(M \bmod N) > 0,$$

where the notation "M mod N" denotes the integer remainder of integer M when divided by integer N.

Let $$K = (M \bmod N).$$

DRLE(S) will consist of some number of repeaters, namely $$(M-K)/N,$$

of the form [1, N-1]. These repeaters will be followed by a repeater of the form [1, K-1] when K is not zero. Furthermore, it may be that S has some residual bits whose length is $$R = L(S) \bmod (2^W-1),$$

so that if R is not zero, DRLE(S) will end with a literal of the form [1, R, 0].

Using these, $$L(DRLE(S)) = ((M-K)/N) * L(\text{repeater}) + \text{residual} + R$$

where residual is 0 if K is zero and L(repeater) otherwise.

For the typical digital printing case, L(S) will be large so the impact upon L(DRLE(S)) will be adequately approximated by $$(M/N) * L \text{ (repeater)}$$

For N=2, this reduces to $$(M/2) * 2 = M$$

and the compression ratio will be $$R(DRLE(S)) = L(S)/M.$$

Note that L(S) is $$M * (2^W-1)$$

so, for N=2 we have $$R(DRLE(S)) = M * (2^W-1)/M = 2^W-1.$$

For W=5, R(DRLE(S)) is 31.

Note that this computation is based upon an all zero binary value for S. It should also be noted that the general result for a repeating pattern of a double run with length $2^W-1$ yields the same compression ratio $2^W-1$. Therefore, the choice of W is very important.

Example 3

Generalizing Example 2 shows the best compression ratio possible for a single repeating double run of length of $2^W-1$ bits with N=2 is $2^W-1$. This example computes the highest compression ratio for a repeating pattern having N double runs. Again, let L(S) denote the length of a sequence S of binary data such that S contains n double runs, $L_1, L_2, \ldots, L_n$, that repeat themselves M times as a pattern throughout S. In other words, $$S = L_1 L_2 \ldots L_n L_1 L_2 \ldots L_n \ldots L_1 L_2 \ldots L_n \text{ residual.}$$

For example, FIG. 2 shows a repeating pattern {4,3} {2,5} that occurs 3 times.

L(DRLE(S)) is the accumulated lengths of one instance of the pattern of the literals, the repeaters, and the residual. For simplicity, assume there is not any residual as it is inconsequential for large L(S).

The length of the literals for one instance of the pattern is the sum of the lengths of each literal in the pattern. This is $$L(\text{all literals}) = n * (1 + 2 * W).$$

The remaining (M-1) instances of the pattern are represented by repeaters. The length of the repeaters is $$L(\text{all repeaters}) = (M-1) * (1 + \text{ceiling}(\log_2 N)).$$

Therefore, $$L(DRLE(S)) = n * (1 + 2 * W) + ((M-1) * (1 + \text{ceiling}(\log_2 N))).$$

For W=5 and N=2, this reduces to $$L(DRLE(S)) = 11 * n + 2 * (M-1).$$

For large M and small n (e.g., 2) this converges to 2*(M-1). Note that this result does not vary with respect to the lengths of the double runs. Consequently, the compression ratio is maximized if the doubles runs in the repeating pattern are of maximum length, and is minimized if the opposite is true (i.e., each double run represents the pattern "01").

A maximum length repeating pattern of double runs for arbitrary W and N is of the form $$\{2^W-1, 2^W-1\}\ \{2^W-1, 2^W-1\} \ldots \{2^W-1, 2^W-1\}.$$

where the number of double runs in this pattern totals N. The length of this pattern is $$N * 2 * (2^W-1).$$

Applying this to the case of large M and N=2, a compression ratio is obtained of:

$$R(DRLE(S)) = (M * 4 * (2^W-1))/(2 * (M-1)).$$

For large M, (M-1) can be replaced with M yielding an approximate result of $$2*(2^{W}-1)=2^{W+1}-2.$$

This is exactly twice the result of Example 2 as one would expect.

In the case of W=5, the best obtainable compression ratio for N=2, therefore, is approximately 62.

Application To Gray-Scale Data

The following description applies the results of the prior description to gray-scale data. Gray-scale data is binary data that represents a monochrome digital image, or a single plane of a multi-planar digital color image at one bit per pixel per plane, typically to be printed by an ink jet or laser printer.

In a digital image, each bit of data is called a pixel. A value of one for a pixel typically means the pixel is "inked" (e.g., with black ink or toner), and a value of zero means the pixel is not inked (i.e., white or the color of the print media).

Typical software systems that provide mixed text and graphics allow a user to use different shades of gray. For example, one may want to use 25% gray in one part of a diagram and 50% gray in another. Other parts may not have any gray and some may be fully black (0% and 100% gray respectively).

When a shade of gray is eventually rendered into binary data, the percentage of gray is approximated by the ratio of inked pixels over the gray area and dispersing these inked pixels over that area. The dispersal process typically approximates the gray while trying to minimize the possibility of unpleasant visual patterns (i.e., moire patterns).

The dispersal is usually represented by a pattern called a halftone. A halftone is typically a small rectangle of pixels that represents a value of gray and is called a halftone cell. The number of inked pixels relative to the total number of pixels in the cell determines the percentage of gray the cell represents. For example, a 4-by-4 cell can represent up to 17 shades of gray.

It is worth noting that the size of a halftone cell is normally small. A 16-by-16 cell is typical and can represent up to 257 gray values which is more than most applications need.

Figures 5A, 5B:
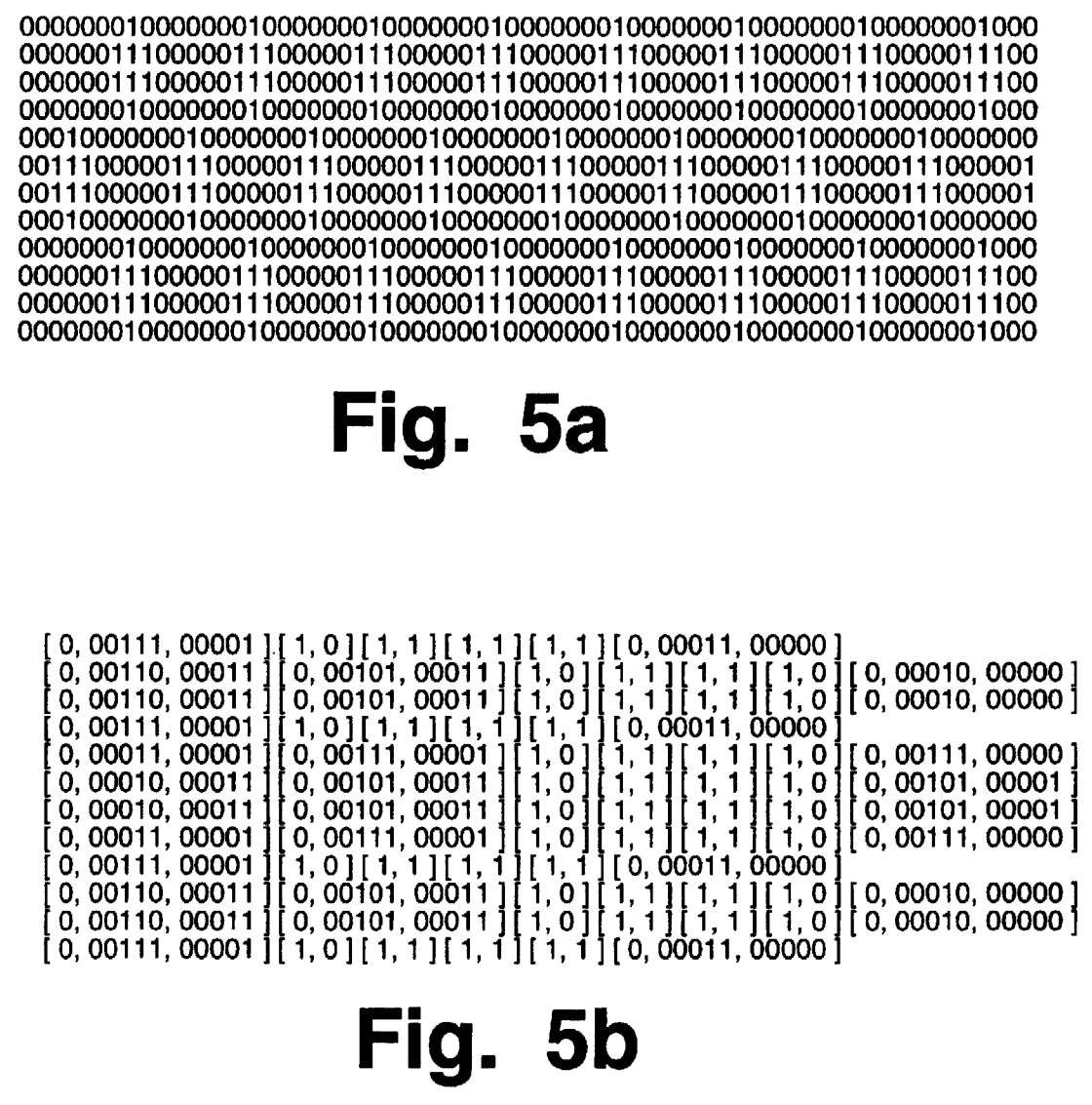

FIG. 5(a) shows an example of a halftone in a portion of a digital image. In this cut there are 12 scan lines. A scan line is one line of pixels in a digital image. Within this portion of data is a halftone pattern representing 25% gray. In this example, the longest run is only 7 pixels, and the smallest is 1 pixel. It is evident that for 1-bit patterns, RLE will not deal well with this.

FIG. 5(b) shows DRLE with MR applied individually to each scan line. Compression typically applied a scan line at a time so as to provide the greatest flexibility with regard to overall compression (consider a page with gray-scale data and a photographic image on it, those scan lines with image data may not compress that well with DRLE and may require some other form of compression). The result is 32 literals and 48 repeaters for a total length of $$(32*11)+(48*2)=448 \text{ bits.}$$

In this example, the width of a scan-line cut is only 83 pixels and there are 12 such scan lines. So, the raw image size is $$(12*83)=996 \text{ bits.}$$

The compression ratio of this example, therefore, is $$996/448=2.22.$$

In a 300 dot-per-inch (dpi) image, 83 bits of a scan line is only 0.28 inches, and at 600 dpi is only 0.14 inches. These dpi levels are typical of today's digital printers. Therefore in reality, a scan-line on a typical 8½ by 11 inch sheet of paper is typically 2,550 pixels at 300 dpi and 5100 pixels at 600 dpi. A typical cut of gray-scale data containing a repeating pattern is going to exceed 0.28 or 0.14 inches. Therefore, in a realistic example, the effects upon the compression ratio of the repeaters will have a greater impact then that of this example, and higher compression ratios will result.

Because of the small size of a halftone cell, gray-scale data that is halftoned does not lend itself well to traditional RLE. This is because the size of the runs are small yielding a small compression ratio, as the length of the length field of the run is not much different than the length of the run itself. Or, RLE may not compress this data at all and may actually expand it.

DRLE is an adaptive lossless compression scheme which provides very good compression for classes of data containing variable length patterns of ones and zeros in which each pattern is small. DRLE is especially applicable to gray-scale data that has been halftoned, the types of data typical in a digital representation of a text and graphics document developed on a computer and targeted for either a one bit per pixel per plane color printer or a monochrome printer. Therefore, the amount of storage required to hold documents of this type is significantly reduced.

Storage reduction by compression is a necessary element of low-cost high-resolution digital imaging systems, namely ink jet and laser printers. This is necessary as storage is an expensive feature. Eliminating or reducing storage is an effective way of developing a cost-competitive product.

Within a laser printer, once the paper for a given page starts moving through the printer, it moves continuously. During this period, the software and hardware is required to deliver the scan lines to the laser under real-time constraints. Therefore, it is important for a decompression scheme to be computationally efficient. It should be clear the decompression scheme of DRLE is very simple. Further, for N=2 and most recent history (MR), the compression algorithm for DRLE is also straightforward. DRLE, therefore, in addition to providing high compression ratios, is very easy to implement efficiently lending itself to both software and hardware implementations in real-time environments.

Software Implementation

An example of a software implementation of DRLE is attached hereto as Appendix I which is C language source code. The operation of the program should be readily apparent from the description of the hardware implementation below.

Hardware Implementation

Figure 6:
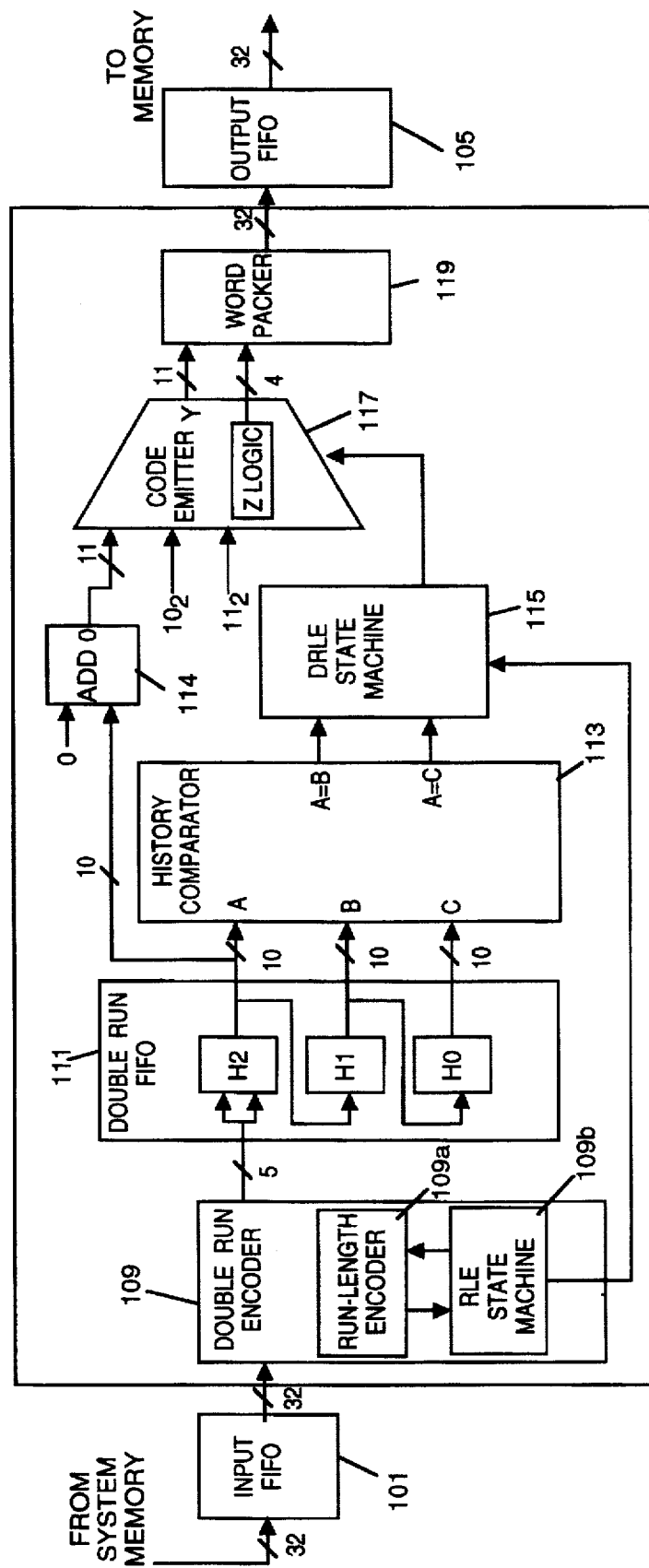
FIG. 6 is a block diagram of a hardware implementation of the invented double run-length encoding technique.

FIG. 6 illustrates a hardware implementation of a DRLE compressor, focusing on the data path and processing stages required to compress a stream of binary data. Data flow is from left to right. Uncompressed source data is read from system memory (e.g., DRAM) and enters the compressor by way of an input FIFO 101. The input FIFO is optional, but allows source data to be read from memory in bursts, to optimize overall system performance. After several stages 103 of processing, as described below, compressed data words are written into an output FIFO 105. The output FIFO is also optional, but again allows compressed data to be written to memory in bursts.

Input FIFO 101

The input FIFO may be implemented as a DMA read FIFO. This FIFO contains logic to generate requests to read from system memory, and to store data from system memory into the FIFO buffer.

Double-Run Encoder 109

The double-run encoder, in turn, is an encoder which issues requests to unload words from the input FIFO. In the described embodiment, the size of a data word is 32 bits. However, other size data words can be handled by using different sized buffers and counters, the specific details of which should be readily apparent to persons skilled in the art. The double-run encoder processing transforms 32-bit data words into 5-bit run-length encodings. Regardless of whether the data enters the double-run encoder as 32-bit words or some other size, it is viewed as a serial stream of binary data. A prior art run length encoder 109a is used to read this serial stream, and count the number of consecutive bits in a 5-bit counter. An internal state machine 109b controls the behavior of the run length encoder, and initially directs it to count zero bits. When a one is reached, the run length encoder's count of zeros is loaded into the most significant half of a register H2 inside double-run FIFO 111, where H2 is a 10-bit register as described below. The internal state machine 109b then directs the run length encoder 109a to count consecutive one bits. When a zero is reached, the run length encoder's count of ones is loaded into the least significant half of register H2. At this point, register H2 contains a valid double-run encoding, and the double-run encoder state machine signals this event to the DRLE State Machine which is described below.

The double-run encoder must deal with two issues while processing the stream. First, a run of zeros or a run of ones may cross a word boundary. When the run length encoder reaches the last bit in a word, the double-run encoder must request another word from the input FIFO. When the input FIFO provides the next word, the run length encoder 109a resumes counting the current run.

Second, the source stream may contain a run of zeros or a run of ones that is greater than 31 bits, the maximum value that can be held by the run length encoder's 5-bit counter. If this occurs, the double-run encoder must break the run into two or more double-run encodings. This special case is handled by RLE state machine 109b. When the run length encoder reaches the 32nd bit in a run, it signals this event to the RLE state machine, which in turn signals DRLE state machine 115 that the value in register H2 is complete. The value in register H2 will equal either {31,0}, if the maximum count was reached while counting a run of zeros, or {n,31}, if reached while counting a run of ones, where n is the number of zeros counted in the previous run. When the value in H2 is accepted, the RLE state machine 109b restarts the run length encoder, which then resumes counting bits where it left off.

The RLE state machine may be implemented using sequential logic according to techniques well known to those skilled in the art. The functionality of the state machine may also be implemented as discrete logic using logic gates, the specific details of which are not critical to an understanding of the invention and which are well known to persons skilled in the art.

Double-Run FIFO 111

Figure 7:
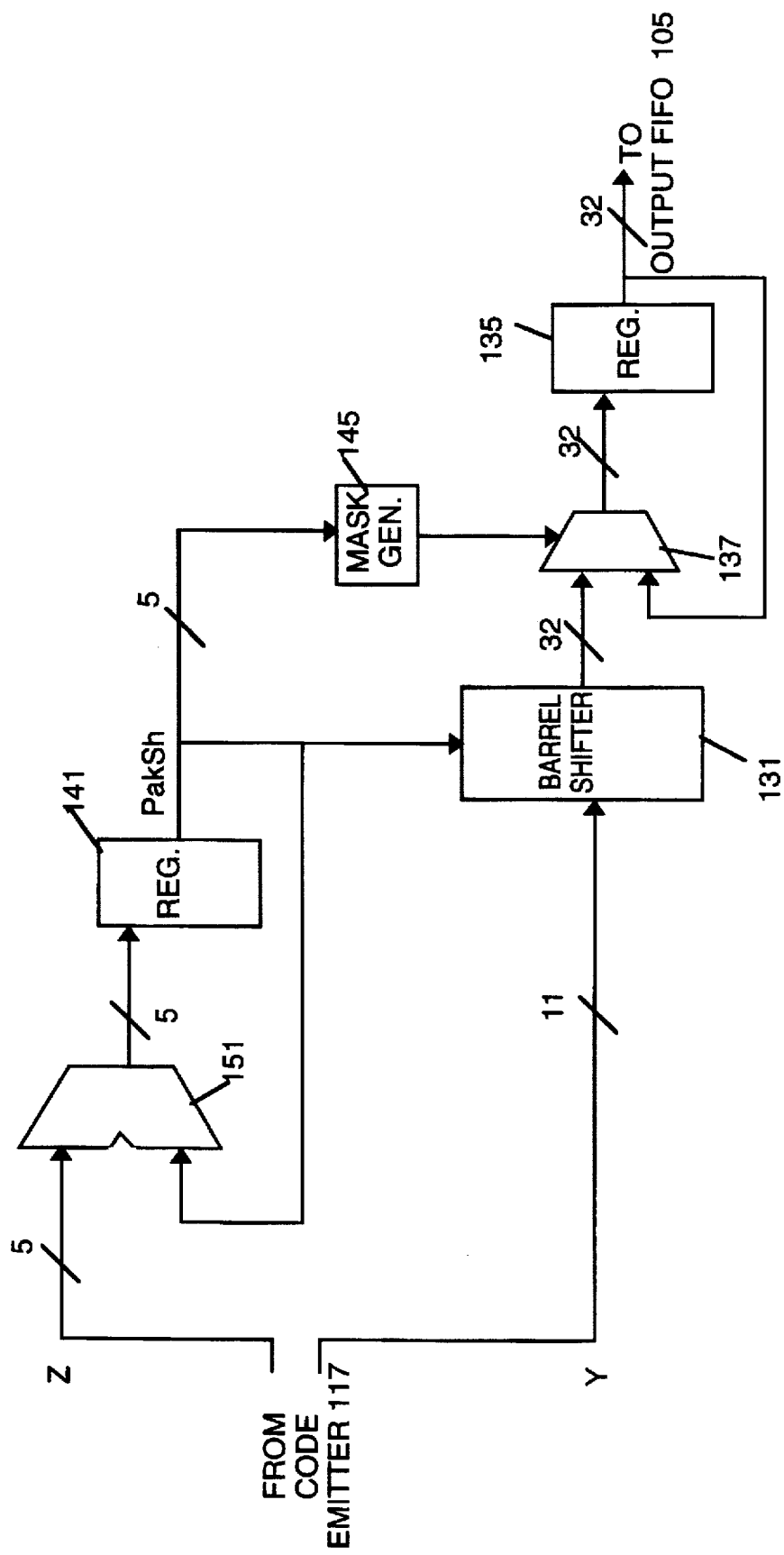
FIG. 7 is a block diagram of a word packer suitable for use with the invention.

The double-run FIFO is simply three 10-bit registers, arranged as a FIFO, that hold the last three results generated by the double run encoder 109. In FIG. 7, the three registers are labeled H2, H1, and H0. At the start of compression, H2 is cleared to zeros, and H1 and H0 are each initialized to {31,0}. This initialization value improves the compression of data streams that start with zero runs. As the double-run encoder produces its first results, they are loaded into H2. The values in H2, H1, and H0 are examined by history comparator 113, which in turn provides data to the DRLE State Machine as described below. When the DRLE state machine acts on the results of the history comparator, the values in registers H2 and H1 are shifted down to registers H1 and H0, respectively, and register H2 is again cleared to zeros. Register H2 can then be used to form the next double-run value.

History Comparator 113

The history comparator performs two comparisons, the results of which are used by the DRLE state machine to control the generation of compression codes. The history comparator contains two 10-bit equality comparators. The first compares register H2 against register H1, and the second compares register H2 against register H0. These comparison results are provided to the DRLE State Machine to control the code emitter 117.

DRLE State Machine 115

The DRLE state machine takes the results from the history comparator, and based on these results selects the type of code to be generated by the code emitter, i.e., Y or Z as described below.

The DRLE state machine may be implemented as a three-state finite state machine (FSM). The initial state is state 0 is one for which no prior double run is under consideration with the current double run (previously A≠C, A≠B). In this case the current double run is either emitted as literal (if it does not match anything in the history, A≠C, A≠B), is emitted as a repeater if it matches the newest entry in the history only (A≠C, A=B), or changes the state if the current double run matches the oldest (A=C, A≠B) (state 1) or both double runs in the history (A=C, A=B) (state 2).

State 1 occurs when the previous double run, when it was current, matched the oldest in the history comparator, but not the newest (previously, A=C, A≠B). In this case, if the current double run matches the current oldest (A=C), then a two element repeater may be emitted. If this is not the case then a literal for the previous must be emitted and the current is either emitted as a literal (A≠B) or a single element repeater (A=B).

State 2 occurs when the previous double run, when it was current, matched both elements in the history comparator (previously, A=C, A=B). In this case, if the current double run matches the current oldest (A=C), then a two element repeater may be emitted. If this is not the case (A≠C), then a single repeater for the previous must be emitted and the current is emitted as a literal.

The DRLE state machine is a state machine which implements the code for the state machine that is described in the software implementation described above as represented by the source code of Appendix 1.

Code Emitter 117

The code emitter generates two outputs, Y and Z. Y contains either a complete 11-bit literal code, a 2-bit single repeat code, or a 2-bit double repeat code. Z contains the size of the code on Y, i.e., 2 or 11. The code emitter is controlled by DRLE state machine 115, based on the results of the history comparator. A literal code is generated by taking the 10-bit value from H2, prepending a 0 as the most significant bit by ADD 0 logic 114, and driving the 11-bit result onto Y; concurrently, a value of 11 (1011 binary) is driven on Z. A single repeat code is generated by simply driving a binary 10 on the least significant bits of Y, and a value of 2 (0010 binary) on Z. Similarly, a double repeat code is generated by driving a binary 11 on the least significant bits of Y, and a value of 2 (0010 binary) on Z. The output signal from DRLE state machine 115 selects one of the three inputs to code emitter 117 which the code emitter places onto Y along with 11 or 2 on Z as described above.

Word Packer 119

The word packer takes a succession of n-bit codes from code emitter 117, and packs them together into 32-bit words. The word packer receives two values from the code emitter—a code, i.e., the value from Y, and the size of the code, i.e., the value from Z. The code emitter only outputs two code sizes: 2 bits and 11 bits. Depending on the code size, the word packer combines the current 2- or 11-bit code value with the previous values it has received, and forms 32-bit words. The word packer must properly deal with codes that cross word boundaries. When enough codes are combined to form a complete 32-bit word, the word packer passes the result onto the output FIFO. Circuitry for implementing the functionality of word packer 119 should be readily apparent to persons skilled in the field of the invention. FIG. 7 is a block diagram of one suitable implementation which shows the data path workings of the word packer block 119. The word packer takes a succession of n-bit codes from code emitter 117, and packes them together into 32-bit words. The word packer receives two values from the code emitter—a code, i.e., the value from Y, and the size of the code, i.e., the value from Z.

The word packer of FIG. 7 uses a 32-bit barrel shifter 131 at its core. The 32-bit barrel shifter rotates a code value delivered on Y into position so that it can be combined with previous code values that have been concatenated into 32-bit register 135. A 32-bit wide 2:1 mux 137 combines the current code value with the previous string of concatenated code data, and the new concatenation is saved in the 32-bit register 135. When the 32-bit register fills up or overflows, the word packer passes the result on to the output FIFO 105.

The 4-bit value on Z indicates the size of the code on Y. Values of Z are accumulated into a 5-bit register 141, and the output of this register, labeled PakSh, directly controls the operation of the barrel shifter, and indirectly controls the operation of the 32-bit wide 2:1 MUX 137 which contains 32 individually controllable 2:1 MUXes. The PakSh value is converted from a simple 5-bit binary value to a 32-bit mask by mask generator 145. PakSh values of 0x00, 0x01, 0x02, . . . , 0x1F produce 32-bit mask values 0x00000000, 0x80000000, 0xC0000000, . . . , 0xFFFFFFFF, respectively. The bit values from this 32-bit mask then directly and individually control each of the thirty-two 2:1 MUXes to select either current or previous code data. In this manner, the 32-bit wide 2:1 MUX 137 combines the current code value with the previous string of code values, so that the new combination may be loaded into the 32-bit register 135.

A small state machine, not shown above, controls the loading of the 5-bit and 32-bit registers 141 and 135, and the enabling of the mask generator 145. It also monitors the sum and carry output (also not shown) from the ALU 131 to determine if the current code will fill or overflow the 32-bit register. In either of these two cases, after the 32-bit register 135 is loaded, the result must be passed onto the output FIFO 105. In the later case, the overflow portion of the current rotated code must be loaded at the starting bit position in the 32-bit register, before the next code value is combined. The state machine handles this sequencing.

Output FIFO 105

Output FIFO may be implemented as a DMA write FIFO. This FIFO stores 32-bit words from word packer 117, and writes the words back into memory. The compressed data stored in memory is passed to a decoder, the output of which is the same as the original input file.

The decoder reverses the processing described above. Implementation details for a suitable decoder should be readily apparent to persons skilled in the art.

Although the foregoing describes a particular implementation of a double run length encoder, numerous changes may be made such as using a different word size or having more than three registers H1–H2, more than three comparisons by the history comparator, more than three states in the DRLE state machine and/or making pairs of 1's and 0's instead of 0's and 1's and using 1 as the prepended code indicating a literal instead of 0 and using 0 to indicate repeaters instead of 1 without departing from the spirit and scope of the invention as defined in the following claims.

APPENDIX 1

```c
#include "stddef.h"
#include "stdlib.h"
#include "stdio.h"

/* A 'C' version of a preferred embodiment of Double Run-Length Encoding (DRLE).
 *
 * This program contains a complete 'C' program that reads an input file, encodes
 * that file into DRLE format, and writes out an the encoding to an output file.
 *
 * Preferred Parameterization:
 *
 *     W = 5    - number of bits used to designate a run (maximum run is 31 bits)
 *
 *     N = 2    - maximum number of double runs in the history buffer
 *
 *     History Algorithm: MR - most recent pattern change
 */

/* Global Contants */
#define W                 5    /* Fixed width of a run length */
#define MAX_RUN_LENGTH   31    /* 2**W - 1 */

/*
 * Input/Output Parameters and Return Codes
 */
#define BUFFER_SIZE 4096 /* Input/Ouput buffer size */
#define E_OK           0 /* Successful Return Code  */
#define E_EOF         -1 /* End-of-file Return Code */

/*
 * DRLE Compressor Finite State Machine States
 */
#define STATE_0  0       /* No outstanding matches                         */
#define STATE_1  1       /* Last DoubleRun matches the oldest in history   */
#define STATE_2  2       /* Last DoubleRun matches both in history         */

/*
 * Double Run data structure
 */
typedef struct
{
    unsigned n_zeros; /* #zeros in a double run (only 1st W bits matter)   */
    unsigned n_ones;  /* #ones in a double run  (only 1st W bits matter)   */
}
    DoubleRun, *DoubleRunPtr;

/*
 * Global Variables
 */
static FILE           *InputFilePtr         /* Input file to compress       */
                    , *OutputFilePtr;       /* DRLE encoded output file     */
static unsigned char *InputBufferBasePtr    /* Input buffer origin          */
                    , *OutputBufferBasePtr; /* Output buffer origin         */
static unsigned char *CurrentInputPtr       /* Current input buffer pointer */
                    , *CurrentOutputPtr;    /* Current output buffer pointer*/
static unsigned char CurrentInputBit        /* Current input bit index      */
```

-1-

```
                      , CurrentOutputBit      /* Current output bit index    */
                      , CurrentInputByte      /* Current input byte value    */
                      , CurrentOutputByte;    /* Current output byte value   */
static unsigned         BytesToCompress       /* Bytes left in input buffer  */
                      , BytesToWrite;         /* Bytes in output buffer      */
/*
 * Pre-allocated double runs for default history
 */
static DoubleRun    DoubleRunHistoryBuffer[2];
/*
 * Double run history buffer: oldest at index 0
 */
static DoubleRunPtr History[2];

/*
 * Global Macros
 */
/*
 * Compare 2 double runs for equality
 */
#define EQUAL_DOUBLE_RUNS(A,B)   ( ((A).n_zeros == (B).n_zeros) && \\
                                   ((A).n_ones  == (B).n_ones)    \\
                                 )
/*
 * Begin Function Bodies
 */

/*+  InitHistory
 *
 *   Initialize the double run history buffer
 */
static void InitHistory()
{
    unsigned i;

for (i = 0; i < 2; ++i)
    {
       DoubleRunHistoryBuffer[i].n_zeros = MAX_RUN_LENGTH;
       DoubleRunHistoryBuffer[i].n_ones  = 0;
       History[i]     = &DoubleRunHistoryBuffer[i];
    }
}

/*+  UpdateHistory()
 *
 *   Add a new double run to the history buffer
 *
 *   The oldest double run in the history is purged.
 *   The most recent double run in the history is made the oldest.
 *   The new double run is placed in the history buffer as the
 *   most recent.
 */
static void UpdateHistory(DoubleRunPtr NewDoubleRunPtr)
{
    DoubleRunPtr DRToReplacePtr;

DRToReplacePtr  = History[0];    /* Re-use the oldest              */
    History[0]      = History[1];    /* The most recent is now         *
```

```
                                       * the oldest                   */
    History[1]      = DRToReplacePtr;  /* The new one is now          *
                                       * most recent                  */
    *DRToReplacePtr = *NewDoubleRunPtr; /* The value of the most recent *
                                       * is the value of the new one */ return;
}

/*+ GetInputByte
 *
 * Read one byte from the input file.
 *
 * If the input buffer is empty
 *    Read the input file into the input buffer
 *    Reset the input file indicators
 * If the end-of-the-input-file has been reached then
 *    Return end-of-file
 * Otherwise
 *    Consume one input file byte and give it to the caller
 *    Return OK
 */
static int GetInputByte(unsigned char *BytePtr)
{
    int ReturnCode;        /* Input return code         */ if (!BytesToCompress)  /* Need to input ?           */
    {
        /*
         * Read the input file and reset the input file indicators
         */
        BytesToCompress = fread( InputBufferBasePtr
                               , 1
                               , sizeof(unsigned char)*BUFFER_SIZE
                               , InputFilePtr
                               );
        CurrentInputPtr = InputBufferBasePtr;
    } if (!BytesToCompress)            /* No more input data?        */
        ReturnCode = E_EOF;          /* Return end-of-file         */
    else                             /* Still have input data      */
    {
        --BytesToCompress;           /* Take one byte              */
        *BytePtr =
            *CurrentInputPtr++;      /* Give the byte to the caller */
        ReturnCode = E_OK;           /* Indicate successful read    */
    } return ReturnCode;
}

/*+ PutOutputByte
 *
 * Write one byte to the output file.
 *
 * If the output buffer is full
```

-3-

```
*     Write the output buffer to the output file
*     Reset the output file indicators
*   Append the byte to the end of the output buffer
*/
static void PutOutputByte(unsigned char Byte)
{
    /* If the output buffer is full then output the buffer and
     * reset the indicators
     */
    if (BytesToWrite == (BUFFER_SIZE*sizeof(unsigned char)))
    {
        fwrite( OutputBufferBasePtr
              , 1
              , BUFFER_SIZE*sizeof(unsigned char)
              , OutputFilePtr
              );

BytesToWrite = 0;
    }

/* Set the current output buffer character pointer whenever
     * the output buffer counter is in an initial state
     */
    if (!BytesToWrite)
        CurrentOutputPtr = OutputBufferBasePtr;

*CurrentOutputPtr++ = Byte;     /* Append the byte to the end of  *
                                     * the output buffer              */
    ++BytesToWrite;                 /* Update the consumption count   */ return;
}

/*+ PutOutputBits
 *
 * Output some bits to the output file
 *
 * For each bit to output
 *    Map the bit to the current output-byte's bit-position
 *    Update the current output-byte's bit-position
 *    If the current output byte is full
 *       Output the current output byte to the output file
 *       Reset the current output byte
 *
 * Note: The bits used in the input parameter 'Bits' are the
 *       'NumBits' least significant ones.
 *
 *       No more than sizeof(unsigned) bits may be written
 *       in a single call.
 */
static void PutOutputBits(unsigned Bits, unsigned NumBits)
{
    unsigned BitToOutput;

/* For each bit to output */
    for( BitToOutput = 1 << (NumBits-1);
         BitToOutput;
```

-4-

```
            BitToOutput >>= 1
        )
    {
        /* If the bit is on in the input bits then turn it on in the current
         * output byte
         */
        if (Bits & BitToOutput)
            CurrentOutputByte |= CurrentOutputBit;

/* Update the current output bit position */
        CurrentOutputBit >>= 1;

/* If the curret output byte is full then output and reset the
         * current output byte
         */
        if (!CurrentOutputBit)
        {
            PutOutputByte(CurrentOutputByte);
            CurrentOutputByte = 0;
            CurrentOutputBit  = 0x80;
        }
    } return;
}

/*+ EmitLiteral
 *
 * Output a literal to the output file
 *
 * Output the literal tag ('0')
 * Output the number of zeros
 * Output the number of ones
 */
static void EmitLiteral(DoubleRunPtr EmitDoubleRunPtr)
{
    PutOutputBits(0, 1);                              /* Output Literal Tag */
    PutOutputBits(EmitDoubleRunPtr->n_zeros, W);      /* Output zero count  */
    PutOutputBits(EmitDoubleRunPtr->n_ones,  W);      /* Output one  count  */ return;
}

/*+ EmitRepeater
 *
 * Output a repeater to the output file
 *
 * Output the repeater tag ('1')
 * Output the number of repetitions
 */
static void EmitRepeater(unsigned RepeaterLength)
{
    PutOutputBits(1, 1);                   /* Output Repeater Tag */
    PutOutputBits(RepeaterLength, 1);      /* Output Repeater Length */ return;
}
```

-5-

. . .

```
/*+ GetRun
 *
 * Get a run of specific gender from the input file
 *
 * While there is input data and
 *       the maximum run-length has not been exceeded and
 *       a change in gender has not occurred
 *    If the current input bit is of the requested gender (zero or one)
 *       Increase the length of the run
 *    Otherwise
 *       Indicate a gender change has occurred.
 */
static unsigned GetRun(unsigned char Gender)
{
   unsigned RunLength;
   unsigned GenderChange;
   unsigned CurrentBitValue;

/* Get an input byte to start with if one is not partially processed
    * already
    */
   if (!CurrentInputBit)
      if (GetInputByte(&CurrentInputByte) == E_OK)
         CurrentInputBit = 0x80;

/* Initialize run length and gender change indicator */
   RunLength     = 0;
   GenderChange  = 0;

/*  While there is input data and
    *        the maximum run-length has not been exceeded and
    *        a change in gender has not occurred
    */
   while(RunLength < MAX_RUN_LENGTH && CurrentInputBit && !GenderChange)
   {
      /* Get the current input bit's truth value */
      CurrentBitValue = (CurrentInputByte & CurrentInputBit);

/* A gender change has occurred if the current input is opposed to
       * the gender requested gender.
       *
       * In this case, the input indicators do not change as the bit that
       * caused the gender change must be accounted for in later calls.
       */
      if ((CurrentBitValue && !Gender) || (!CurrentBitValue && Gender))
         GenderChange = 1;

/* If no gender change has occurred then update the run length
       * and the input indicators
       */
      else
      {
         ++RunLength;
         CurrentInputBit >>= 1;
         if (!CurrentInputBit)
            if (GetInputByte(&CurrentInputByte) == E_OK)
               CurrentInputBit = 0x80;
      }
```

```
    } return RunLength;
}

/**+ GetDoubleRun
 *
 * Get a double run from the input file
 *
 * Note: A double run with both the number of zeros and ones
 *       equalling zero is the same as no more input data.
 */
static void GetDoubleRun(DoubleRunPtr GetDoubleRunPtr)
{
    GetDoubleRunPtr->n_zeros = GetRun(0);
    GetDoubleRunPtr->n_ones  = GetRun(1);

return;
}

/**+ MAIN
 *
 * Perform DRLE on a named input file, output the result to a named
 * output file.
 *
 * This version implements a three-state finite state machine (FSM).
 *
 * The initial state (0) is one for which no prior double run is under
 * consideration with the current double run. In this case the current
 * double run is either emitted as literal (if it does not match
 * anything in the history), is emitted as a repeater if it matches
 * the newest entry in the history only, or changes the state depending
 * if it the current double run matches the oldest (state 1) or both
 * double runs in the history (state 2).
 *
 * State 1 occurs when the previous double run, when it was current,
 * matched the oldest in the history buffer, but not the newest. In
 * this case, if the current double run matches the current oldest,
 * then a two element repeater may be emitted. If this is not the case
 * then a literal for the previous must be emitted and the current is
 * either emitted as a literal or a single element repeater depending
 * upon the value of the newest element in the history.
 *
 * State 2 occurs when the previous double run, when it was current,
 * matched both elements in the history buffer. In this case, if the
 * current double run matches the current oldest, then a two element
 * repeater may be emitted. If this is not the case then a single
 * repeater for the previous must be emitted and the current is
 * either emitted as a literal or a single element repeater depending
 * upon the value of the newest element in the history.
 *
 */
int main(int narg, char *argv[])
{
    DoubleRun  CurrentDoubleRun;
    unsigned   CurrentState;
```

```
/* Program setup: validate parameters, open files, and
 * allocate input and output buffers
 */
if (narg != 3)
{
   printf("DRLE in_file out_file\n");
   exit(0);
}

InputBufferBasePtr = (unsigned char *) malloc(BUFFER_SIZE*sizeof(unsigned char));
if (!InputBufferBasePtr)
{
   printf("DRLE in_file out_file - cannot allocate %u bytes for the input buffer\n"
          , (unsigned) (BUFFER_SIZE*sizeof(unsigned char)));
   exit(0);
}

OutputBufferBasePtr = (unsigned char *) malloc(BUFFER_SIZE*sizeof(unsigned char));
if (!OutputBufferBasePtr)
{
   printf("DRLE in_file out_file - cannot allocate %u bytes for the output buffer\n"
          , (unsigned) (BUFFER_SIZE*sizeof(unsigned char)));
   exit(0);
}

InputFilePtr = fopen(argv[1], "rb");
if (!InputFilePtr)
{
   printf("DRLE in_file out_file - cannot open in_file(%s)\n", argv[1]);
   exit(0);
}

OutputFilePtr = fopen(argv[2], "wb");
if (!OutputFilePtr)
{
   printf("DRLE in_file out_file - cannot open out_file(%s)\n", argv[2]);
   exit(0);
}

/* Initialize global control variables */
BytesToCompress  = BytesToWrite     = 0;
CurrentInputBit  = 0;
CurrentOutputBit = 0x80;
CurrentInputByte = CurrentInputByte = 0;

/* The rest is the an example of the preferred Most Recent (MR) history
 * pattern matching encoding
 *
 * Note: In this version, the element in History[1] always contains the
 *       value of the previous double run in states 1 and 2.
 */
InitHistory();
for( GetDoubleRun(&CurrentDoubleRun),
     CurrentState = STATE_0 ;
     CurrentDoubleRun.n_zeros || CurrentDoubleRun.n_ones;
     GetDoubleRun(&CurrentDoubleRun)
   )
{
```

-8-

```
switch(CurrentState)
{
   case STATE_0:  /* No pending action on the previous double run read */ if (EQUAL_DOUBLE_RUNS(CurrentDoubleRun, *History[0]))
         if (EQUAL_DOUBLE_RUNS(CurrentDoubleRun, *History[1]))
            CurrentState = STATE_2;
         else
            CurrentState = STATE_1;
      else
      if (EQUAL_DOUBLE_RUNS(CurrentDoubleRun, *History[1]))
         EmitRepeater(0);              /* Output a repeater '10' */
      else
         EmitLiteral(&CurrentDoubleRun);

break;

case STATE_1:  /* The previous double run read matched the oldest in
                   * the history. We may or may not have a repeater of 2
                   * double runs depending upon the value of the current
                   * double run.
                   */ if (EQUAL_DOUBLE_RUNS(CurrentDoubleRun, *History[0]))
         EmitRepeater(1);
      else
      {
         EmitLiteral(History[1]);
         if (EQUAL_DOUBLE_RUNS(CurrentDoubleRun, *History[1]))
            EmitRepeater(0);
         else
            EmitLiteral(&CurrentDoubleRun);
      }
      CurrentState = STATE_0;
      break;

case STATE_2:  /* The previous double run matched both entries in the
                   * history. We have to emit either a repeater for
                   * the previous double run or a repeater for 2 double
                   * runs depending upon the value of the current double
                   * run.
                   */
      if (EQUAL_DOUBLE_RUNS(CurrentDoubleRun, *History[0]))
         EmitRepeater(1);
      else
      {
         EmitRepeater(0);
         if (EQUAL_DOUBLE_RUNS(CurrentDoubleRun, *History[1]))
            EmitRepeater(0);
         else
            EmitLiteral(&CurrentDoubleRun);
      }
      CurrentState = STATE_0;

break;
}

/* With Most Recent (MR) Pattern Matching, the current double run is always
```

-9-

```
       * added to the history buffer
       */

UpdateHistory(&CurrentDoubleRun);
   }

/* May have a residual double run to account for */
   switch(CurrentState)
   {
      case STATE_0:
         break;

case STATE_1:
         EmitLiteral(History[1]);
         break;

case STATE_2:
         EmitRepeater(0);
         break;
   }

/* May have a residual output byte to account for */
   if (CurrentOutputBit != 0x80)
      PutOutputByte(CurrentOutputByte);

/* May have residual output bytes to account for */
   if (BytesToWrite)
      fwrite(OutputBufferBasePtr, 1, BytesToWrite, OutputFilePtr);

/* Release storage */
   free(InputBufferBasePtr);
   free(OutputBufferBasePtr);

/* Close files */
   fclose(InputFilePtr);
   fclose(OutputFilePtr);

/* Leave */
   return 0;
}
```

We claim:

1. A system for performing lossless compression of binary data comprising:
   a) means for run length encoding a stream of binary data as encoded pairs, each encoded pair representing a run of 0's and a run of 1's;
   b) means for storing a history of said encoded pairs;
   c) means for comparing a current encoded pair with at least first and second prior encoded pairs from said history;
   d) means for
      i) selecting one of:
         1) said current encoded pair to which has been added a first prepended code, and
         2) one of:
            a first code indicating that said current encoded pair matched said second prior encoded pair and did not match said first prior encoded pair, and
            a second code indicating that said current encoded pair matched said second prior encoded pair and said first prior encoded pair, said first and second codes having added thereto a second prepended code, and
      ii) generating as an output said selected one, and a length of said selected one;
   e) means for packing said output into words having a predetermined length.

2. The system defined by claim 1 wherein said run length encoding means comprises a run length encoder coupled to a run length state machine which operates to cause said run length encoder to request data from an input source and convert said data to pairs, wherein the first element of each pair is a number indicating the number of consecutive 0's received from the input source, and the second element of each pair is a number indicating the number of consecutive 1's received from the input source, said run length state machine further operating to generate a signal indicating the end of each consecutive 0's and consecutive 1's pairings.

3. The system defined by claim 1 wherein said history storing means comprises a FIFO having a first register coupled to a second register and a third register coupled to said second register, each of said registers having two halves, one of which stores consecutive 0's and the other of which stores consecutive 1's generated by said run length encoder means.

4. The system defined by claim 3 wherein said comparator means comprises a comparator which compares the contents of said first register to said second register and to said third register, and generates corresponding first and second comparison signals indicating the results of said comparisons.

5. The system defined by claim 1 further comprising:
   a) a prepending code means for prepending said first prepended code to said current encoded pair;
   b) a repeating code means for generating said first and second codes.

6. The system defined by claim 5 wherein said selecting means comprises:
   a) a double run length state machine coupled to said comparator means and said history means and said run length encoding means;
   b) a code emitter multiplexor coupled to, said prepending code means, said repeating code means, and said double run length state machine, said multiplexor selecting for its output one of said current encoded pair with said first prepended code, and said first code and said second code with said second prepended code based upon signals received from said double run length state machine;
   c) logic coupled to said multiplexor for generating the length of the selected one.

7. The system defined by claim 6 wherein said packing means comprises:
   a) an accumulator coupled to said logic and receiving as one input the generated length of the selected one and generating a sum and carry output;
   b) a register coupled to said accumulator and receiving as its input, the sum output of said accumulator and providing its contents as a second input to said accumulator;
   c) a barrel shifter coupled to said code emitter multiplexor and receiving as its data input the selected output from said code emitter multiplexor;
   d) mask generator means coupled to said register for generating a mask output based upon the contents of said register;
   e) a set of 2:1 multiplexors coupled to said barrel shifter and said mask generator means each having as one input a corresponding one of the outputs of said barrel shifter;
   f) a second register coupled to said set of 2:1 multiplexors having its output coupled as corresponding second inputs to said set of 2:1 multiplexors.

8. A method for performing lossless compression of binary data comprising the steps of:
   a) run length encoding a stream of binary data as encoded pairs, each encoded pair representing a run of 0's and a run of 1's;
   b) storing a history of said encoded pairs;
   c) comparing a current encoded pair with at least first and second prior encoded pairs from said history;
   d) selecting one of:
      1) said current encoded pair to which has been added a first prepended code, and
      2) one of:
         a first code indicating that said current encoded pair matched said second prior encoded pair and did not match said first prior encoded pair, and
         a second code indicating that said current encoded pair matched said second prior encoded pair and said first prior encoded pair, said first and second codes having added thereto a second prepended code, and
   e) generating as an output said selected one and a length of said selected one; and
   f) packing said output into words having a predetermined length.

9. The method defined by claim 8 wherein said run length encoding step comprises the step of requesting data from an input source and converting said data to pairs, wherein the first element of each pair is a number indicating the number of consecutive 0's received from the input source, and the second element of each pair is a number indicating the number of consecutive 1's received from the input source, and generating a signal indicating the end of each consecutive 0's and consecutive 1's pairings.

10. The method defined by claim 9 wherein said history storing step comprises the steps of storing said consecutive 0's and 1's generated by said run length encoder step in a FIFO having a first register coupled to a second register and a third register coupled to said second register, each of said registers having two halves, one of which stores consecutive 0's and the other of which stores consecutive 1's.

11. The system defined by claim 10 wherein said comparing step comprises the steps of comparing the contents of said first register to said second register and to said third register and generating corresponding first and second comparison signals indicating the results of said comparisons.

12. The method defined by claim 8 further comprising the steps of:
a) prepending said first prepended code to said current encoded pair;
b) generating said first and second codes.

* * * * *